United States Patent
Su et al.

(10) Patent No.: US 9,043,638 B1
(45) Date of Patent: May 26, 2015

(54) METHOD FOR ENHANCING MEMORY FAULT TOLERANCE

(71) Applicant: Quanta Computer Inc., Tao Yuan Shien (TW)

(72) Inventors: Mei-Lin Su, Tao Yuan Shien (TW);
Wei-Chun Wang, Tao Yuan Shien (TW);
Wei-Yu Chien, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

(21) Appl. No.: 14/542,355

(22) Filed: Nov. 14, 2014

(51) Int. Cl.
| G06F 11/00 | (2006.01) |
| G11C 29/38 | (2006.01) |
| G11C 29/44 | (2006.01) |
| G06F 11/07 | (2006.01) |
| G06F 11/22 | (2006.01) |

(52) U.S. Cl.
CPC .............. *G11C 29/38* (2013.01); *G11C 29/44* (2013.01); *G06F 11/073* (2013.01); *G06F 11/0787* (2013.01); *G06F 11/2268* (2013.01); *G06F 11/22* (2013.01); *G06F 11/006* (2013.01)

(58) Field of Classification Search
CPC ... G06F 11/006; G06F 11/22; G06F 11/2268; G06F 11/073; G06F 11/0787
See application file for complete search history.

(56) References Cited

U.S. PATENT DOCUMENTS

| 4,817,091 | A | 3/1989 | Katzman et al. |
| 6,223,301 | B1 | 4/2001 | Santeler et al. |
| 6,282,622 | B1* | 8/2001 | Morris ..................... 711/170 |
| 6,463,550 | B1 | 10/2002 | Cepulis et al. |
| 6,564,346 | B1 | 5/2003 | Vollrath et al. |
| 6,948,094 | B2 | 9/2005 | Schultz et al. |
| 7,251,744 | B1 | 7/2007 | Housty |
| 7,945,841 | B2 | 5/2011 | Swanson et al. |
| 8,291,176 | B2 | 10/2012 | Hilland et al. |
| 8,458,514 | B2 | 6/2013 | Harris et al. |
| 8,839,032 | B2 | 9/2014 | Walton et al. |
| 2002/0104045 | A1* | 8/2002 | Cooper ..................... 714/42 |
| 2009/0055680 | A1* | 2/2009 | Honda et al. ............... 714/5 |
| 2011/0299317 | A1* | 12/2011 | Shaeffer et al. ............ 365/106 |
| 2014/0068360 | A1* | 3/2014 | Lai et al. ..................... 714/718 |

OTHER PUBLICATIONS

Chapin et al., "Hive: Fault Containment for Shared-Memory Multiprocessors", Retrieved from: Hive: Fault Containment for Shared-Memory Multiprocessors (Dec. 1995). (15 pages).

* cited by examiner

*Primary Examiner* — Charles Ehne
(74) *Attorney, Agent, or Firm* — Novak Druce Connolly Bove + Quigg LLP

(57) ABSTRACT

Various examples of the present technology provide systems and methods for testing whether there is any memory error in a server system, determining physical memory addresses corresponding to a detected memory error on one or more memory devices of the server system, and preventing the physical memory addresses corresponding to the detected memory error from accessing by an operating system, application programs, and/or other components of the server system.

20 Claims, 5 Drawing Sheets

METHOD FOR ENHANCING MEMORY FAULT TOLERANCE

TECHNICAL FIELD

The present technology relates generally to server systems.

BACKGROUND

Modern servers are running faster than ever before. Server systems typically include a combination of hardware and software components, application programs, operating systems, processors, buses, and memory. Each server relies on physical memory (e.g., dynamic random access memory (DRAM)), for processing. Besides processors, memory is one of the most performance-critical resources for servers and also constitutes a significant portion of the total server hardware costs.

Memory modules are often paired with processors on a system board of a server. When more and more processors provided on the system board, more memory modules are required to accommodate processing needs of the increased number of processors. However, an increased number of memory modules also increases the memory fail rate on the server. This can represent a significant cost increase. Therefore, there is a need to enhance memory fault tolerance in server systems.

SUMMARY

Systems and methods in accordance with various embodiments of the present technology provide a solution to the above-mentioned problems by masking physical memory addresses corresponding to detected bad dies on a memory device to enhance memory fault tolerance in server systems. More specifically, various embodiments of the present technology provide methods for testing whether there is any memory error on one or more memory devices of a server system, determining physical memory addresses corresponding to a detected memory error on the one or more memory devices, and preventing the physical memory addresses corresponding to the detected memory error from accessing by an operating system, application programs, and/or other components of the server system. In conventional server systems, whenever a memory error or bad die is detected on a memory device, the entire memory device has to be physically replaced. In contrast, the various embodiments of the present technology provide a faster and more cost-efficient method to enhance memory fault tolerance without physically replacing memory devices in server systems.

In some embodiments, a server system may include a plurality of nodes, each of which includes a server, basic input/output system (BIOS) and baseboard management controller (BMC). Each server may include at least one processor. The BMC may be configured to manage an interface between system software and hardware components in a corresponding node. In some implementations, in response to a parameter of the system software and hardware components in the corresponding node going beyond a preset limit that indicates a potential failure of the node, the BMC may send out an alert.

In some embodiments, a memory-test component is provided in a server system to test whether there is a memory error. The memory-test component can be a hardware, software or both, and configured to compare data from a memory device in the server system with a reference data and determine whether a memory error has occurred. Some embodiments detect the memory error by writing data to one or more memory devices in the server system, reading data from the memory devices, and comparing the writing data and the reading data to determine whether there is any memory error. In some embodiments, the reading data from the one or more memory devices can be compared with each other to determine whether there is any memory error in the memory devices.

In some embodiments, in response to one or more bad dies being detected on one or more memory devices in a server system, a memory topology of the memory devices can be determined. Physical memory addresses corresponding to the one or more bad dies are masked from access if the memory topology remains unchanged since a previous topology determination. In some embodiments, a memory topology includes connection information between one or more memory devices and at least one memory controller.

In some embodiments, a predetermined range of physical addresses adjacent to physical addresses corresponding to a memory error may also be added to a memory mask list of a server system and masked from accessing by an operating system, application programs, and/or other components in the server system. Some embodiments may include physical addresses of adjacent dies of a detected bad die to a memory mask list and mark the physical addresses as "Unusable."

In some embodiments, in response to physical addresses in a memory mask list being masked from access, pages corresponding to the physical addresses can be recovered by using error correction schemes. In some embodiments, portions of one or more memory devices can be dynamically reserved as a reserved memory to mirror data stored in the one or more memory devices. In response to physical addresses in a memory mask list being masked from access, pages corresponding to the physical addresses can be copied from the reserved portions of the one or more memory devices.

In some embodiments, a process to detect whether there is a memory error in a server system can be activated in response to a BIOS, power-on self-test (POST)), operating system (OS), or a memory self-test being executed.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which.

DETAILED DESCRIPTION

Figure 1:
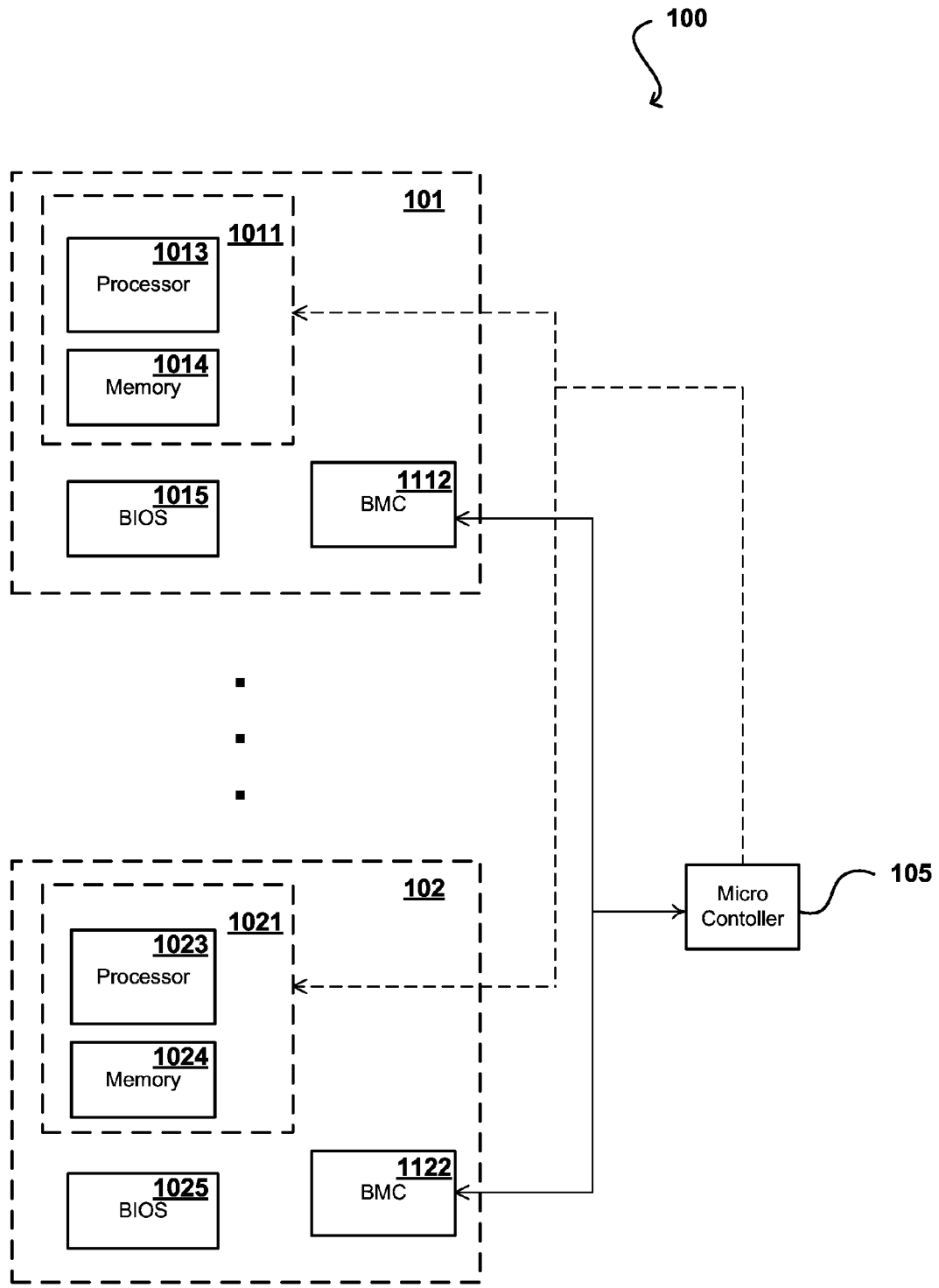
FIG. 1 illustrates a schematic block diagram of an exemplary server rack in accordance with an embodiment of the present technology.

FIG. 1 illustrates a schematic block diagram of an exemplary server rack 100 in a telecommunications network in accordance with an embodiment of the present technology. In this example, the server rack 100 comprises a plurality of nodes (e.g., 101 and 102), and a micro controller 105. The plurality of nodes can operate independently from each other. In some implementations, the plurality of nodes can have a similar computing capacity and similar memory capacity. In other implementations, the plurality of nodes can have various different sizes, computing capacities and memory capacities.

Each node can include a server (e.g., 1011 and 1021), basic input/output system (BIOS) (e.g., 1015 and 1025), and a baseboard management controller (BMC) (e.g., 1112 and 1122). Each server includes at least one processor and a memory device. In this example, the server 1011 includes a processor 1013 and a memory device 1014 and the server 1021 includes a processor 1023 and a memory device 1024.

In the various embodiments of the present technology, BMCs are specialized microcontroller embedded in each of the plurality of nodes, such as BMCs 1112 and 1122 embedded in nodes 101 and 102, respectively. A BMC can be configured to manage an interface between system management software and hardware components in each of the plurality of nodes. In some implementations, different types of sensors built into each of the plurality of nodes can report parameters (e.g., temperature, cooling fan speeds, power status, and/or operating system (OS) status) to a corresponding BMC. A BMC can also monitor sensors on the corresponding node. In response to any parameter on the sensors going beyond preset limits, which can indicate a potential failure of the node, the BMC can send an alert to the micro controller 105, or a system administrator via a network. The micro controller 105 or the administrator can also communicate with the BMC to control hardware components on the corresponding node, or take some corrective action such as resetting or power cycling the node to get a hung OS running again. In some embodiments, a physical interface between a BMC and the micro controller 105 can include, for example, SBMbus buses, an RS-232 serial console, or an Intelligent Platform Management Bus (IPMB) that enables the BMC to accept request messages from the micro controller 105 or other management controllers in the server rack 100 or telecommunications network.

In this example, the BIOS 1015 and 1025 are directly connected to their corresponding servers for initializing and/or testing. The BIOS 104 can be software stored in a read-only memory (ROM) or other stored devices. The BIOS 104 is operable to be loaded into each of the plurality of nodes and initialize or test components of the corresponding node, and then to call for an operating system. The BIOS 104 can also provide an abstraction layer for hardware components, application programs, and operating systems to interact with input/output devices (e.g., keyboard, display). In some embodiments, an operating system can ignore an abstraction layer provided by the BIOS 104 and access hardware components of the corresponding node or the plurality of nodes directly after loading. The micro controller 105 can be interconnected between the switch 103 and each of the plurality of BMCs (e.g., 1112 and 1122) and operable to control the switch 103 for selectively switching to one of the plurality of servers.

Although only servers 1011 and 1021 are shown within the server rack 100 in FIG. 1, various types of electronic or computing devices that are capable of processing data can also be included in server rack 100. Further, the electronic or computing devices in server rack can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the server rack 100, a variety of networking and messaging protocols can be used, including but not limited to TCP/IP, open systems interconnection (OSI), file transfer protocol (FTP), universal plug and play (UpnP), network file system (NFS), common internet file system (CIFS), AppleTalk etc. As would be appreciated by those skilled in the art, the server rack 100 illustrated in FIG. 1 is used for purposes of explanation. Therefore, a network system can be implemented with many variations, as appropriate, yet still provide a configuration of network platform in accordance with various embodiments of the present technology.

In exemplary configuration of FIG. 1, the plurality of nodes (e.g., 101 and 102) can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art.

The plurality of nodes (e.g., 101 and 102) can also include power components for supplying power using various approaches, such as conventional plug-in approaches, a battery operable to be recharged through conventional plug-in approaches, or through other approaches such as wireless (e.g., capacitive or inductive) charging through proximity with a power mat or other such device. Various other elements and/or combinations are possible as well within the scope of various embodiments.

Figure 2:
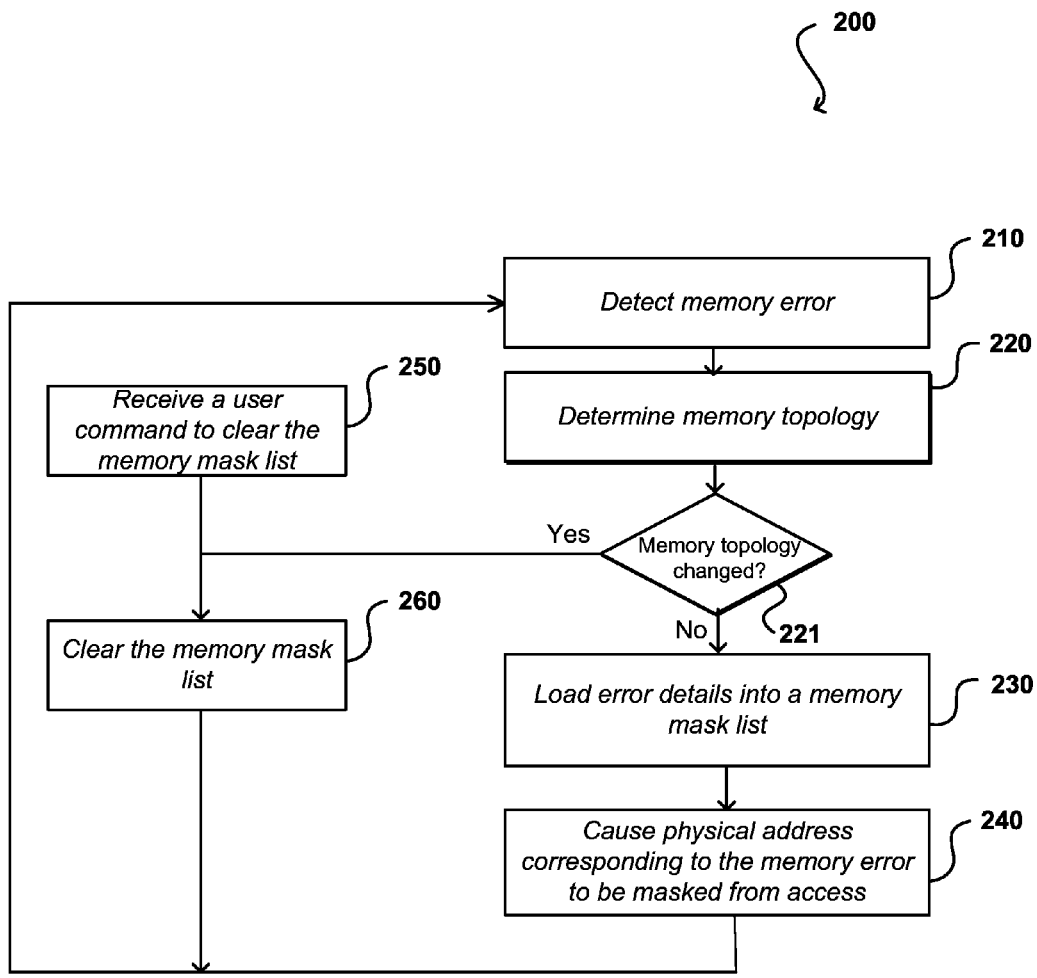
FIG. 2 illustrates an exemplary method of enhancing memory fault tolerance of a computing system in accordance with an embodiment of the present technology.

FIG. 2 illustrates an exemplary method 200 of enhancing memory fault tolerance of a computing system in accordance with an embodiment of the present technology. It should be understood that the exemplary method 200 is presented solely for illustrative purposes and that in other methods in accordance with the present technology can include additional, fewer, or alternative steps performed in similar or alternative orders, or in parallel.

The exemplary method 200 starts with detecting whether the computing system has a memory error, at step 210. In some embodiments, the memory error can be detected by a memory-test component. The memory-test component is configured to compare data from a memory device with reference data and determine whether a memory failure has occurred based at least upon the comparison. In some embodiments, a process of detecting the memory error can comprise writing data to a plurality of memory devices, reading the data from the plurality of memory devices, comparing the read data with the write data, and, in response to at least one of the read data being different from the write data, outputting a memory error signal. In some implementations, the read data from the plurality of memory devices can be compared with each other. In response to at least one of the read data from one of the plurality of memory devices being different from that from another memory device, a memory error signal can be outputted.

In response to detecting the memory error, a memory topology of the memory device can be determined, at step 220. In some implementations, one or more memory controllers in a computing system can be configured to check status and/or other information of the memory device.

In some embodiments, a memory topology can include connection information between memory devices and one or more memory controllers (not shown). For example, a memory controller can be connected to a plurality of memory devices. Some embodiments can group memory devices to respond to a single command to correspond to the bandwidth of the memory controller. In some embodiments, a memory topology can further include a replication device configured to receive address and control information from a memory controller. The replication device can be configured to transmit two or more copies of substantially replicated address and control information to multiple memory devices.

In some embodiments, a memory topology includes one or more local memory devices on a server of a server rack and/or one or more remote memory devices. The one or more remote memory devices can be shared by a plurality of servers on a server rack. The one or more local memory devices can be main memory for the corresponding server. The one or more remote memory devices can be configured to store pages evicted from the one or more local memory devices. In response to a miss in the one or more local memory devices, a remote page stored on the one or more remote memory devices can be migrated to the local memory devices.

In some embodiments, one or more local memory devices on a server can include two or more types (e.g., higher performance and cost, and lower performance and cost). Memory devices with higher performance (e.g., DRAM) can be used to store active pages/data used by a processor on the server while memory devices with lower performance (e.g., Non-volatile random-access memory (NVRAM)) can be used to store idle or infrequently accessed pages/data.

After the memory topology is determined, at step 220, a determination can be made on whether the memory topology has changed compared with a previous memory topology, at step 221. In some embodiments, conventional memory diagnostic techniques during a system startup can be used to compare a newly determined memory topology with a previous determined memory topology.

If the memory topology has not changed, memory error details can be loaded into a memory mask list, at step 230. The memory mask list can be stored in a BIOS-readable device (e.g., NVRAM or EEPROM). The memory error details may include physical addresses associated with the memory error. A physical address space of a processor on a server can be the physical address space that is mapped from a virtual space address by a page table used by an OS hosted by the processor. In some embodiments, the physical address space of a processor on a server can be an aggregation of one or more local memory devices on the server and/or a portion of one or more remote memory devices.

At step 240, the physical addresses corresponding to the memory error can be prevented from accessing by programs and hardware components of the server. In some embodiments, based upon the memory mask list, a system BIOS can configure identified addresses in the memory mask list as "Unusable" and prevent the OS, application software and other hardware components from accessing the physical addresses. In some embodiments, a predetermined range of physical addresses adjacent to the physical addresses corresponding to the memory error can also be added to the memory mask list and masked from access to enhance memory fault tolerance of the server. In some embodiments, physical addresses of a die and/or adjacent dies corresponding to the memory error can be all included in the memory mask list and masked from access.

In some embodiments, in response to the physical addresses corresponding to a memory error being masked from access, pages corresponding to the physical addresses can be recovered by using error correction schemes (e.g., Reed-Solomon error correction schemes). In some embodiments, portions of one or more local memory devices can be dynamically reserved as a reserved memory to mirror or duplicate data stored in the one or more local memory devices. In response to the physical addresses corresponding to the memory error being masked from access, pages corresponding to the physical addresses can be retrieved or copied from the reserved portions of the one or more local memory devices.

If the memory topology has changed, the memory mask list can be cleared, at step 260, and a process to detect whether there is a memory error on the server can be run in a next step. In some embodiments, a user can send a command to clear the memory mask list. Therefore, in response to receiving the user command to clear the memory mask list, at step 250, the method 200 can proceed to clear the memory mask list, at step 260, and restart method 200 to detect whether there is a memory error on the server.

Figure 3:
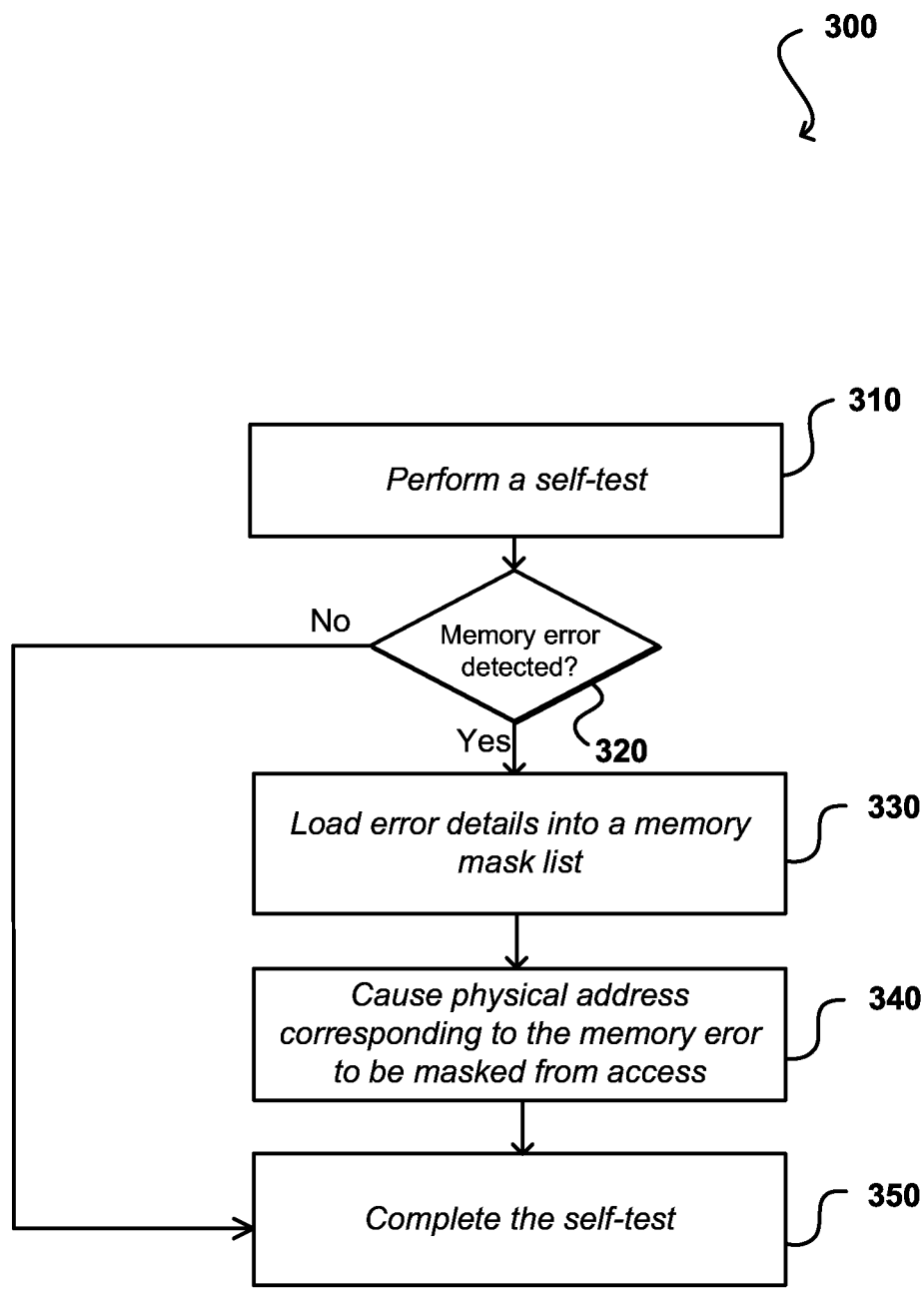
FIG. 3 illustrates an exemplary method of performing a self-test to enhance memory fault tolerance in a server system in accordance with an embodiment of the present technology.

FIG. 3 illustrates an exemplary method 300 for performing a self-test to enhance memory fault tolerance in a server system in accordance with various embodiments of the present technology. The exemplary method 300 starts with performing a self-test at step 310. The self-test can be a part of a system booting, a part of a program executing, or a user initiated self-test process. If the self-test is a system booting, a BIOS can be executed. In response to a "hard" system booting, a power-on self-test (POST) can be first performed to make sure hardware components of the server perform normally. For a "soft" system booting, the POST can be avoided.

In some embodiments, a process to detect memory errors can be executed in response to the BIOS or POST being executed, or a self-test being executed by an application program. At step 320, a determination can be made on whether there is any memory error in the server system. In response to a memory error being detected, memory error details can be loaded to a BIOS-readable device (e.g., NVRAM or EEPROM). The memory error details can include physical addresses associated with the memory error. According to the memory mask list, identified physical addresses in the memory mask list can be configured as "Unusable" and prevented from accessing by the OS, application software and other hardware components of the server.

In response to identified physical addresses in the memory mask list being masked from access or no memory error being detected, the self-test can be completed at step 350. In some embodiments, if the self-test is part of system booting, a boot loader can be loaded into a memory device (e.g., loaded into a memory location 0000:7C00) to be executed. The boot loader is operable to load an operating system or other software for the server. In some embodiments, some sub-systems of a server can begin functioning by simply running operational programs that are stored in ROM during a system booting.

In some embodiments, if a BIOS is damaged during system booting at step 310, one or more local memory devices or other storage devices can be checked to find out whether there is a backup of the BIOS. If the backup file of the BIOS can be found, the backup file can be written into a memory of the BIOS. A reboot process can then be performed. In some embodiments, damaged portions of the BIOS can be selectively replaced. If the backup file of the BIOS cannot be found on the server, the server can retrieve the backup file from a remote memory device or download the backup file of the BIOS corresponding to the server from the Internet. A processor of the server can read the backup BIOS file and write the backup file into the BIOS memory.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 4:
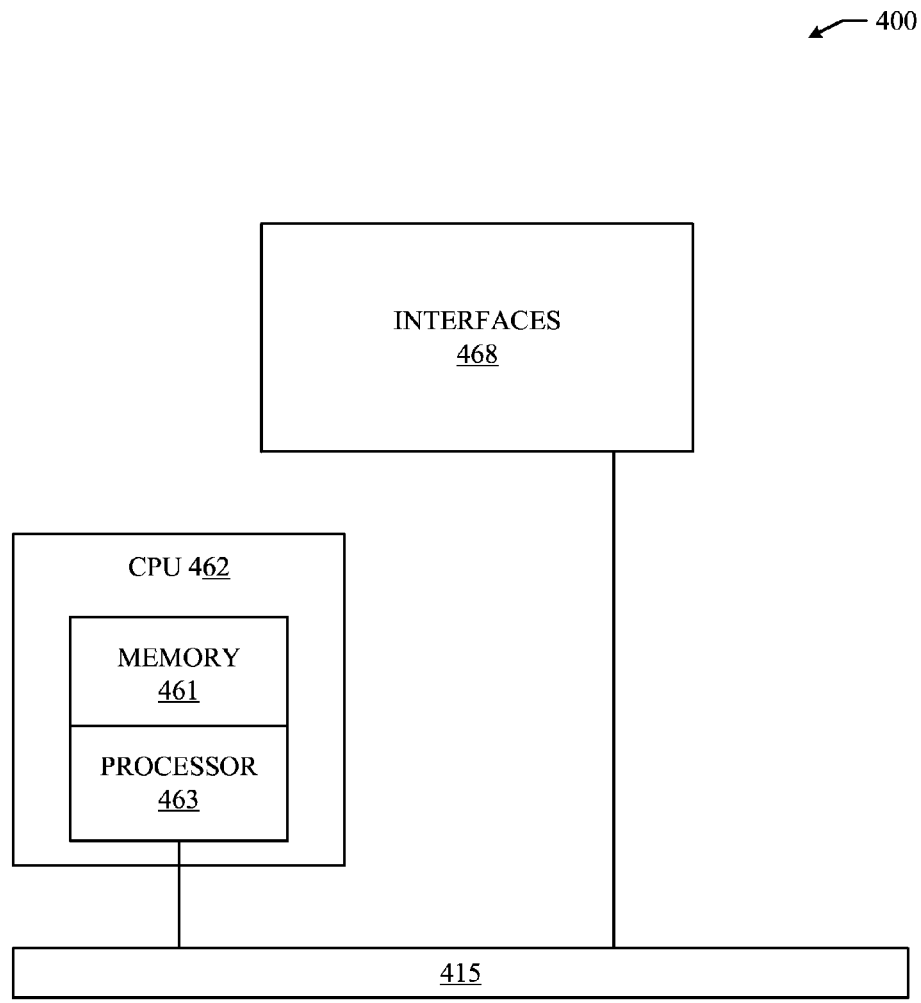
FIG. 4 illustrates an exemplary computing device in accordance with various implementations of the technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 4 and 5, is disclosed herein. These variations shall be described herein as the various examples are set forth. The technology now turns to FIG. 4.

FIG. 4 illustrates an example computing device 400 suitable for implementing the present technology. Computing device 400 includes a master central processing unit (CPU) 462, interfaces 468, and a bus 415 (e.g., a PCI bus). When acting under the control of appropriate software or firmware, the CPU 462 is responsible for executing packet management, error detection, and/or routing functions, such as miscabling detection functions, for example. The CPU 462 preferably accomplishes all these functions under the control of software including an operating system and any appropriate applications software. CPU 462 can include one or more processors 463 such as a processor from the Motorola family of microprocessors or the MIPS family of microprocessors. In an alternative embodiment, processor 463 is specially designed hardware for controlling the operations of the computing device 400. In a specific embodiment, a memory 461 (such as non-volatile RAM and/or ROM) also forms part of CPU 462. However, there are many different ways in which memory could be coupled to the system.

The interfaces 468 are typically provided as interface cards (sometimes referred to as "line cards"). Generally, they control the sending and receiving of data packets over the network and sometimes support other peripherals used with the computing device 400. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 462 to efficiently perform routing computations, network diagnostics, security functions, etc.

Although the system shown in FIG. 4 is one specific network device of the present invention, it is by no means the only network device architecture on which the present invention can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 461) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 5A:
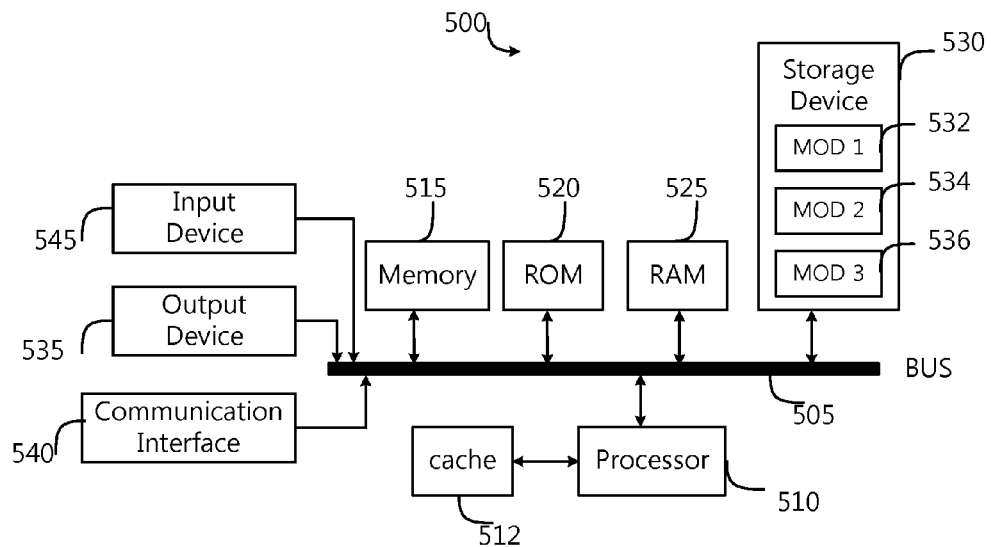
FIGS. 5A and 5B illustrate exemplary systems in accordance with various embodiments of the present technology.
Figure 5B:
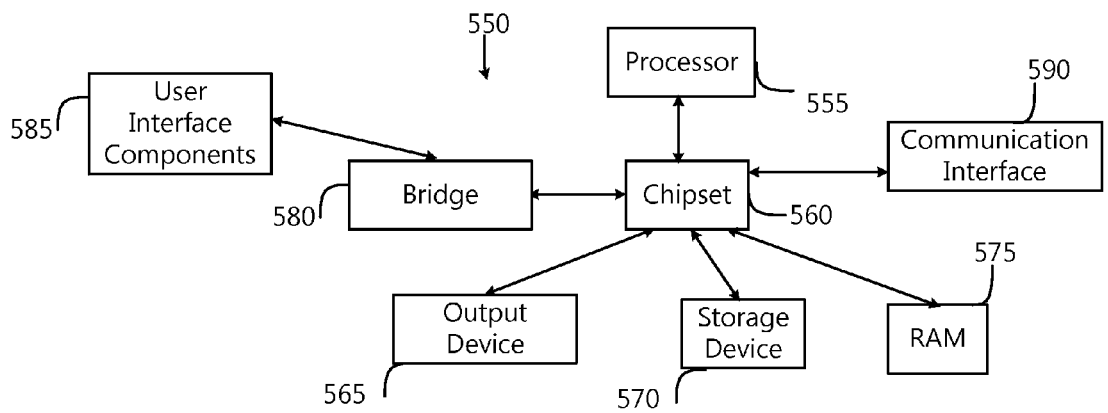

FIG. 5A, and FIG. 5B illustrate example possible systems in accordance with various aspects of the present technology. The more appropriate embodiment will be apparent to those of ordinary skill in the art when practicing the present technology. Persons of ordinary skill in the art will also readily appreciate that other system examples are possible.

FIG. 5A illustrates a conventional system bus computing system architecture 500 wherein the components of the system are in electrical communication with each other using a bus 505. Example system 500 includes a processing unit (CPU or processor) 510 and a system bus 505 that couples various system components including the system memory 515, such as read only memory (ROM) 520 and random access memory (RAM) 525, to the processor 510. The system 500 can include a cache of high-speed memory connected directly with, in close proximity to, or integrated as part of the processor 510. The system 500 can copy data from the memory 515 and/or the storage device 530 to the cache 512 for quick access by the processor 510. In this way, the cache can provide a performance boost that avoids processor 510 delays while waiting for data. These and other modules can control or be configured to control the processor 510 to perform various actions. Other system memory 515 can be available for use as well. The memory 515 can include multiple different types of memory with different performance characteristics. The processor 510 can include any general purpose processor and a hardware module or software module, such as module 532, module 534, and module 536 stored in storage device 530, configured to control the processor 510 as well as a special-purpose processor where software instructions are incorporated into the actual processor design. The processor 510 can essentially be a completely self-contained computing system, containing multiple cores or processors, a bus, memory controller, cache, etc. A multi-core processor can be symmetric or asymmetric.

To enable user interaction with the computing device 500, an input device 545 can represent any number of input mechanisms, such as a microphone for speech, a touch-sensitive screen for gesture or graphical input, keyboard, mouse, motion input, speech and so forth. An output device 535 can also be one or more of a number of output mechanisms known to those of skill in the art. In some instances, multimodal systems can enable a user to provide multiple types of input to communicate with the computing device 500. The communications interface 540 can generally govern and manage the user input and system output. There is no restriction on operating on any particular hardware arrangement and therefore the basic features here can easily be substituted for improved hardware or firmware arrangements as they are developed.

Storage device 530 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 525, read only memory (ROM) 520, and hybrids thereof.

The storage device 530 can include software modules 532, 534, 536 for controlling the processor 510. Other hardware or software modules are contemplated. The storage device 530 can be connected to the system bus 505. In one aspect, a hardware module that performs a particular function can include the software component stored in a computer-readable medium in connection with the necessary hardware components, such as the processor 510, bus 505, output device 535 (e.g., a display), and so forth, to carry out the function.

FIG. 5B illustrates a computer system 550 having a chipset architecture that can be used in executing the described method and generating and displaying a graphical user interface (GUI). Computer system 550 is an example of computer hardware, software, and firmware that can be used to implement the disclosed technology. System 550 can include a processor 555, representative of any number of physically and/or logically distinct resources capable of executing software, firmware, and hardware configured to perform identified computations. Processor 555 can communicate with a chipset 560 that can control input to and output from processor 555. In this example, chipset 560 outputs information to output 565, such as a display, and can read and write information to storage device 570, which can include magnetic media, and solid state media, for example. Chipset 560 can also read data from and write data to RAM 575. A bridge 580 for interfacing with a variety of user interface components 585 can be provided for interfacing with chipset 560. Such user interface components 585 can include a keyboard, a microphone, touch detection and processing circuitry, a pointing device, such as a mouse, and so on. In general, inputs to system 550 can come from any of a variety of sources, machine generated and/or human generated.

Chipset 560 can also interface with one or more communication interfaces 590 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 555 analyzing data stored in storage 570 or RAM 575. Further, the machine can receive inputs from a user via user interface components 585 and execute appropriate functions, such as browsing functions by interpreting these inputs using processor 555.

It can be appreciated that example systems 500 and 550 can have more than one processor 510 or be part of a group or cluster of computing devices networked together to provide greater processing capability.

For clarity of explanation, in some instances the present technology can be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Various aspects of the present technology provide methods for unifying various types of end-point identifiers by mapping end-point identifiers to synthetic addresses and allowing different forms of lookups to be uniformly handled. While specific examples have been cited above showing how the optional operation can be employed in different instructions, other examples can incorporate the optional operation into different instructions. For clarity of explanation, in some instances the present technology can be presented as including individual functional blocks including functional blocks comprising devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present invention can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technology can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server farm can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present technology.

The specification and drawings are, accordingly, to be regarded in an illustrative rather than a restrictive sense. It will, however, be evident that various modifications and changes can be made thereunto without departing from the broader spirit and scope of the invention as set forth in the claims.

What is claimed is:

1. A server system, comprising:
   at least one processor; and
   memory including instructions that, when executed by the at least one processor, cause the system to:
   detect at least one memory error in at least one memory device of the server system;
   in response to detecting the at least one memory error, determine a current memory topology of the server system;
   in response to the current memory topology being unchanged compared to a previous memory topology, load information regarding the at least one memory error into a memory mask list, the information including physical addresses in the at least one memory device associated with the at least one memory error; and
   cause the physical addresses in the at least one memory device to be prevented from accessing by software and other hardware components of the server system.

2. The system of claim 1, wherein the server system includes one or more nodes, each node containing a baseboard management controller (BMC), basic input/output system (BIOS), and a server, the server including at least one processor; the BMC configured to manage an interface between server system software and hardware components of a corresponding node; and the instructions when executed further cause the system to:
   send, via the BMC, an alert to a micro controller of the server system or a system administrator over a network, when at least one parameter of the software and hardware components of a node of the server system is beyond a preset limit associated with a potential failure of the node.

3. The system of claim 1, wherein the server system includes a memory-test component, the memory-test component configured to compare data from the at least one memory device with reference data and, based at least upon a comparison result, determine whether the memory error has occurred on the at least one memory device.

4. The system of claim 3, wherein the instructions when executed further cause the system to:
   write data to the at least one memory device;
   read the data from the at least one memory device;
   compare the write data with the read data from the at least one memory device; and
   in response to at least one of the reading data being different from the writing data, indicate that the memory error has occurred.

5. The system of claim 3, wherein the instructions when executed further cause the system to:
- write data to the at least one memory device;
- read the data from the at least one memory device;
- compare the read data from the at least one memory device; and
- in response to at least one of the read data from one of the at least one memory device being different from that from another one of the at least one memory device, indicate that the memory error has occurred.

6. The system of claim 1, wherein the current memory topology including connection information between the at least one memory device and at least one memory controller of the server.

7. The system of claim 1, wherein the instructions when executed further cause the system to:
- add a predetermined range of physical addresses, adjacent to the physical addresses corresponding to the memory error, to the memory mask list; and
- cause the predetermined range of physical addresses in the at least one memory device to be prevented from accessing by the software and hardware components of the server system.

8. The system of claim 1, wherein the instructions when executed further cause the system to:
- add physical addresses of one or more dies corresponding to the memory error and at least one adjacent die of the one or more dies to the memory mask list; and
- cause the physical addresses of the one or more dies corresponding to the memory error and the at least one adjacent die to be prevented from access by the software and hardware components of the server system.

9. The system of claim 1, wherein the instructions when executed further cause the system to:
- dynamically reserve at least one portion of the at least one memory device as a reserved memory to duplicate data stored in the at least one memory device; and
- in response to the physical addresses corresponding to the memory error being prevented from access, retrieve data corresponding to the physical addresses from the reserved memory.

10. The system of claim 1, wherein the server system further comprises one or more nodes, each of the one or more nodes including a basic input/output system (BIOS) for initializing or at least partially testing the at least one memory device.

11. The system of claim 1, wherein the instructions when executed further cause the system to:
- in response to the physical addresses corresponding to the memory error being prevented from access, recover data stored in the physical addresses by using one or more error correction schemes.

12. The system of claim 1, wherein the instructions when executed further cause the system to:
- in response to the current memory topology being changed compared with the previous memory topology or receiving a user command to clear the memory mask list, clear the memory mask list to activate a new process to detect a new memory error.

13. A computer-implemented method for enhancing memory fault tolerance in a server system, comprising:
- detecting at least one memory error in at least one memory device of the server system;
- in response to detecting the at least one memory error, determining a current memory topology of the server system;
- in response to the current memory topology being unchanged compared to a previous memory topology, loading information regarding the at least one memory error into a memory mask list, the information including physical addresses in the at least one memory device associated with the at least one memory error; and
- causing the physical addresses in the at least one memory device to be prevented from accessing by software and other hardware components of the server system.

14. The computer-implemented method of claim 13, further comprising:
- adding a predetermined range of physical addresses, adjacent to the physical addresses corresponding to the memory error, to the memory mask list; and
- causing the predetermined range of physical addresses in the at least one memory device to be prevented from accessing by the software and hardware components of the server system.

15. The computer-implemented method of claim 13, further comprising:
- dynamically reserving at least one portion of the at least one memory device as a reserved memory to duplicate data stored in the at least one memory device; and
- in response to the physical addresses corresponding to the memory error being prevented from access, retrieving data corresponding to the physical addresses from the reserved memory.

16. The computer-implemented method of claim 13, further comprising:
- adding physical addresses of one or more dies corresponding to the memory error and at least one adjacent die of the one or more dies to the memory mask list; and
- causing the physical addresses of the one or more dies corresponding to the memory error and the at least one adjacent die to be prevented from accessing by the software and hardware components of the server system.

17. The computer-implemented method of claim 13, further comprising:
- in response to the physical addresses corresponding to the memory error being prevented from access, recovering data stored in the physical addresses by using one or more error correction schemes.

18. A non-transitory computer-readable storage medium including instructions that, when executed by at least one processor of a server system, cause the server system to:
- detect at least one memory error in at least one memory device of the server system;
- in response to detecting the at least one memory error, determine a current memory topology of the server system;
- in response to the current memory topology being unchanged compared to a previous memory topology, load information regarding the at least one memory error into a memory mask list, the information including physical addresses in the at least one memory device associated with the at least one memory error; and
- cause the physical addresses in the at least one memory device to be prevented from accessing by software and other hardware components of the server system.

19. The non-transitory computer-readable storage medium of claim 18, wherein the instructions when executed further cause the system to:
- send, via a baseboard management controller (BMC), an alert to a micro controller of the server system or a system administrator over a network, when at least one parameter of the software and hardware components of the server system is beyond a preset limit associated with a potential failure of the server system.

20. The non-transitory computer-readable storage medium of claim 18, wherein the instructions when executed further cause the system to:
write data to the at least one memory device;
read the data from the at least one memory device;
compare the write data with the read data from the at least one memory device; and
in response to at least one of the reading data being different from the writing data, indicate that the memory error has occurred.

* * * * *